(12) United States Patent
Anthony et al.

(10) Patent No.: US 6,944,053 B2
(45) Date of Patent: Sep. 13, 2005

(54) MAGNETIC MEMORY WITH STRUCTURE PROVIDING REDUCED COERCIVITY

(75) Inventors: Thomas C. Anthony, Sunnyvale, CA (US); Manoj K. Bhattacharyya, Cupertino, CA (US); Darrel R. Bloomquist, deceased, late of Meridian, ID (US); by Judy Bloomquist, legal representative, Meridian, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 36 days.

(21) Appl. No.: 10/462,979

(22) Filed: Jun. 17, 2003

(65) Prior Publication Data

US 2004/0257867 A1 Dec. 23, 2004

(51) Int. Cl.[7] .............................................. G11C 11/14
(52) U.S. Cl. ....................................... 365/173; 365/171
(58) Field of Search ................................ 365/173, 171; 257/295

(56) References Cited

U.S. PATENT DOCUMENTS

| | | | |
|---|---|---|---|
| 6,072,717 A | 6/2000 | Brug et al. | |
| 6,259,644 B1 | 7/2001 | Tran et al. | |
| 6,297,983 B1 | 10/2001 | Bhattacharyya | |
| 6,358,757 B2 | 3/2002 | Anthony | |
| 6,740,947 B1 * | 5/2004 | Bhattacharyya et al. | 257/421 |
| 2002/0055190 A1 | 5/2002 | Anthony | |
| 2004/0008537 A1 * | 1/2004 | Sharma et al. | 365/173 |
| 2004/0092039 A1 * | 5/2004 | Anthony et al. | 438/3 |

* cited by examiner

*Primary Examiner*—Anh Phung

(57) ABSTRACT

Embodiments of the present invention provide a magnetic memory. In one embodiment, the magnetic memory comprises a magnetic memory cell and a conductor configured to provide a magnetic field to write the magnetic memory cell. Structure is configured to direct the magnetic field and reduce coercivity of the magnetic memory cell.

18 Claims, 3 Drawing Sheets

MAGNETIC MEMORY WITH STRUCTURE PROVIDING REDUCED COERCIVITY

BACKGROUND OF THE INVENTION

One type of non-volatile memory known in the art relies on magnetic memory cells. These devices, known as magnetic random access memory (MRAM) devices, include an array of magnetic memory cells. The magnetic memory cells can be of different types, for example, magnetic tunnel junction (MTJ) memory cells or giant magnetoresistive (GMR) memory cells.

Generally, a magnetic memory cell includes a layer of magnetic film in which the orientation of magnetization is alterable, and a layer of magnetic film in which the orientation of magnetization may be fixed or "pinned" in a particular direction. The magnetic film having alterable magnetization is referred to as a sense layer or data storage layer. The magnetic film that is fixed is referred to as a reference layer or pinned layer.

Conductive traces referred to as word lines and bit lines are routed across the array of memory cells. Word lines extend along rows of the memory cells and bit lines extend along columns of the memory cells. A memory cell stores a bit of information as an orientation of magnetization in its sense layer at each intersection of a word line and a bit line. The orientation of magnetization in the sense layer aligns along an axis of the sense layer referred to as its easy axis. The orientation of magnetization does not easily align along an axis orthogonal to the easy axis, referred to as the hard axis. Magnetic fields can be applied by a write circuit to flip the orientation of magnetization in the sense layer along its easy axis to either a parallel or anti-parallel orientation with respect to the orientation of magnetization in the reference layer.

To write a memory cell, the write circuit selects one word line and one bit line to set or change the orientation of magnetization in the sense layer of the memory cell. The orientation of magnetization in the sense layer of the selected memory cell is rotated in response to write currents on the selected bit line and word line. The write currents may be the same or different in magnitude, where a larger write current creates a stronger magnetic field around the write line. These write currents create magnetic fields according to the right hand rule, which act in combination to rotate the orientation of magnetization in the sense layer.

Typically, the magnetization pattern in the sense layer includes magnetization in an interior region and magnetization in edge regions. Demagnetization fields, often present in the edge regions, increase the intensity of the magnetic field needed to set or switch the state of a memory cell. In addition, as memory cells are decreased in size to increase memory device storage density, the effects of the demagnetization fields increase. The intensity of the magnetic field needed to set or switch the state of a memory cell, i.e., the coercivity, increases as the memory cell gets smaller.

The magnitude of the write currents can be increased to increase the intensity of the magnetic fields. However, larger currents and the resulting stronger magnetic fields can affect the state of adjacent memory cells in the array of memory cells. Additionally, the larger drive transistors required to drive the currents can increase the size and cost of the MRAM devices. The larger currents can also cause electromigration problems in the word and bit lines.

SUMMARY OF THE INVENTION

Embodiments of the present invention provide a magnetic memory. In one embodiment, the magnetic memory comprises a magnetic memory cell and a conductor configured to provide a magnetic field to write the magnetic memory cell. Structure is configured to direct the magnetic field and reduce coercivity of the magnetic memory cell.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
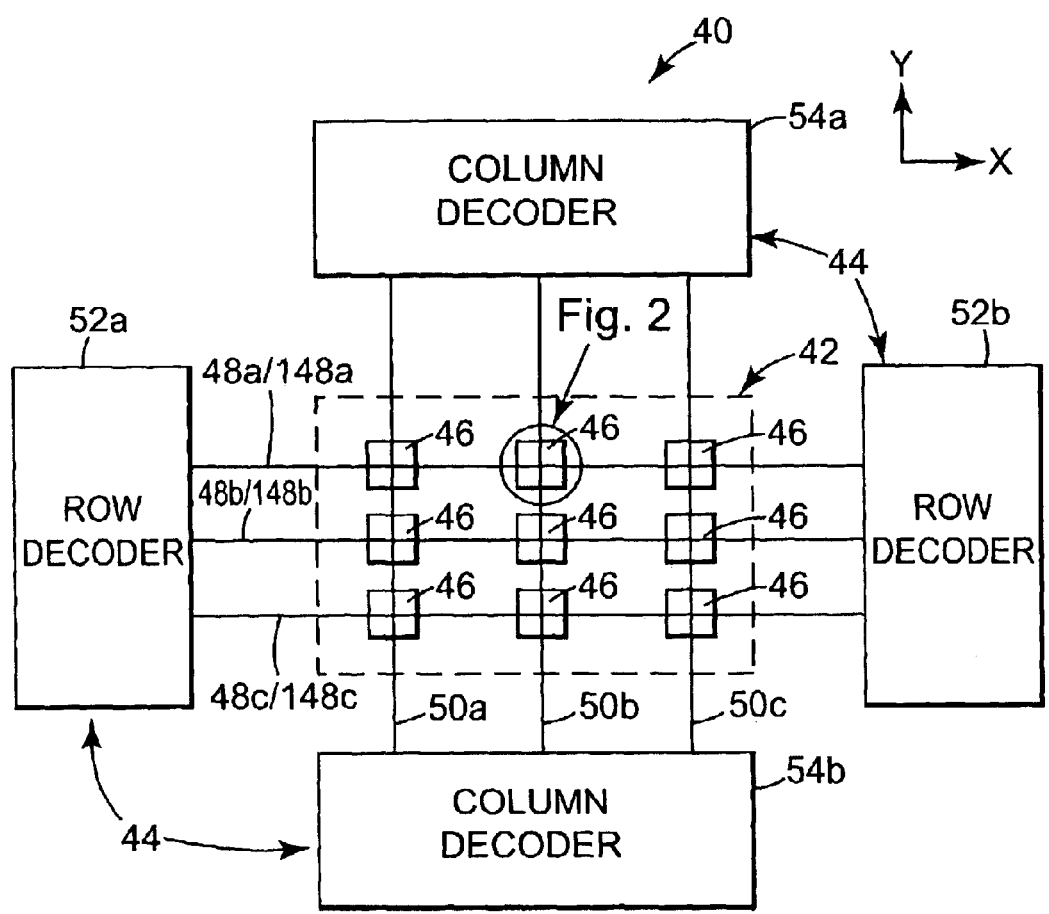
FIG. 1 is a block diagram illustrating a magnetic memory device, according to an exemplary embodiment of the present invention.

FIG. 1 is a block diagram illustrating one exemplary embodiment of a magnetic memory device 40, according to the present invention. The magnetic memory device 40 includes a magnetic memory cell array 42 electrically coupled to a read/write circuit 44. The memory cell array 42 includes magnetic memory cells, indicated at 46 and described herein.

The magnetic memory device 40 includes bit lines 50 and memory cells 46 configured to reduce the coercivity of the memory cells 46. The coercivity of a memory cell 46, as used herein, is the intensity of the magnetic field needed to set or switch the state of the memory cell 46. To reduce the coercivity, bit lines 50 are cladded to direct write magnetic fields and provide flux closure along the hard axis of the memory cells 46. Flux closure for the sense layer magnetization through the write conductor cladding reduces demagnetization fields that occur while rotating the sense layer from the easy axis to the hard axis. Reducing demagnetization fields reduces the coercivity of the memory cell 46. With reduced coercivity, lower currents can be used to create lower intensity magnetic fields to switch the state of the memory cell 46.

The memory cells 46 in array 42 are arranged in rows and columns, with the rows extending along an x-direction and the columns extending along a y-direction. Only a relatively small number of memory cells 46 are shown to simplify the illustration of the magnetic memory device 40. In other embodiments, arrays of any suitable size can be used.

In a 1 Mbit array embodiment, the array is 1024 memory cells 46 high by 1024 memory cells 46 wide. A macro-array is formed using a plurality of individual arrays. The use of multiple arrays allows an MRAM device with a large overall data storage capacity to be built, without the individual arrays becoming so large that they are difficult to manufacture and control.

Design choices available when laying out arrays on a suitable substrate include reducing substrate area for each device. It has been found that the arrays can be manufactured in layers, producing a three dimensional macro-array. In one magnetic memory embodiment having a storage capacity of 128 Mbytes, 1024 1 Mbit arrays are arranged in a macro-array that is 16 arrays wide by 16 arrays high, with four stack layers. Optionally the MRAM device comprises more than one such macro-array.

In the exemplary embodiment, the read/write circuit 44 includes row decoders 52a–52b and column decoders 54a–54b. The column decoders 54a–54b are electrically coupled to first lines, referred to as bit lines 50a–50c and row decoders 52a–52b are electrically coupled to second lines, referred to as word lines 48a–48c. The conductive word lines 48a–48c extend along the x-direction in a plane on one side of the array 42, and the conductive bit lines 50a–50c extend along the y-direction in a plane on an opposing side of the array 42. There is one word line 48 for each row of the array 42, and one bit line 50 for each column of the array 42. A memory cell 46 is located at each cross point of a word line 48 and a bit line 50. In other embodiments, the first lines can be word lines and the second lines can be bit lines.

In the exemplary embodiment, during a write operation, row decoders 52a–52b select one of the word lines 48a–48c and column decoders 54a–54b select one of the bit lines 50a–50c for writing the state of the memory cell 46 located at the selected word line 48a–48c and bit line 50a–50c cross point. Row decoders 52a–52b supply a write current through the selected word line 48a–48c to create a magnetic field in the selected memory cell 46. Row decoders 52 source the write current from row decoder 52a and sink the write current in row decoder 52b, or vice-versa. Column decoders 54a–54b supply a write current through the selected bit line 50a–50c to create a magnetic field in the selected memory cell 46. Column decoders 54 source the write current from column decoder 54a and sink the write current in column decoder 54b, or vice-versa. The write currents supplied by the read/write circuit 44 create magnetic fields around the selected word line 48a–48c and bit line 50a–50c, according to the right hand rule. These magnetic fields combine to set or switch the orientation of magnetization in the selected memory cell 46.

In other embodiments, the row decoders 52a–52b can supply current in only one direction, with the column decoders 54a–54b providing current in both directions. In the alternative, the column decoders 54a–54b can supply current in only one direction, with the row decoders 52a–52b providing current in both directions.

In the 128 Mbyte macro-array, the magnetic memory comprises row decoders that select one row and column decoders that select a plurality of columns to select a plurality of memory cells in each 1 Mbit array. The memory accesses a plurality of 1 Mbit arrays at the same time. The accessed cells within each of the plurality of arrays correspond to a small portion of a unit of data. Together, the accessed cells provide a whole unit of data, such as a whole sector unit of 512 bytes or at least a substantial portion of the sector. Each of the plurality of arrays are accessible substantially simultaneously. In an alternative embodiment, the magnetic memory comprises column decoders that select one column and row decoders that select a plurality of rows.

In the exemplary embodiment, bit lines 50a–50c are cladded with a ferromagnetic material. The cladding has an easy axis orientation of magnetization, which is parallel to the length of the bit line 50a–50c. During a write operation, the cladding directs write magnetic fields through the magnetic memory cell 46 and provides flux closure along the hard axis of the magnetic memory cell 46. Flux closure through the hard axis of the magnetic memory cell 46 reduces demagnetization fields produced while rotating the sense layer from one easy axis orientation, through the hard axis, to the opposite easy axis orientation. Reducing demagnetization fields reduces the coercivity of the magnetic memory cell 46, such that lower write currents can be used to set or switch the state of the memory cell 46.

Figure 2:
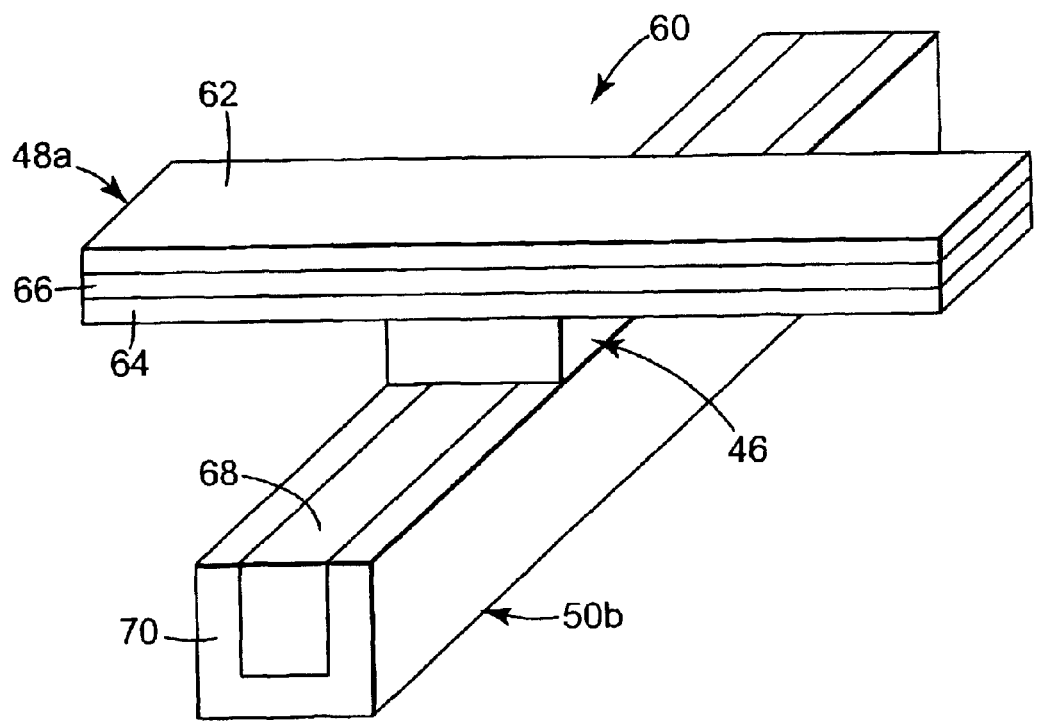
FIG. 2 is a diagram illustrating an exemplary embodiment of an array section.

FIGS. 2–6 illustrate in further detail memory cells and write conductors configured to reduce memory cell coercivity. FIG. 2 is a diagram illustrating an exemplary embodiment of an array section, indicated at 60. Array section 60 includes a magnetic memory cell 46 intersected by a word line 48a and a bit line 50b. The word line 48a includes a sense conductor 64, an isolation layer 66, and a write conductor 62. Memory cell 46 is positioned between bit line 50b and sense conductor 64. Isolation layer 66 is positioned between sense conductor 64 and write conductor 62.

In the exemplary embodiment, write conductor 62 and bit line 50b are electrically coupled to read/write circuit 44. Write currents passed through write conductor 62 and bit line 50b create magnetic fields, according to the right hand rule, in memory cell 46. Sense conductor 64 and bit line 50b are electrically coupled to the read/write circuit 44 to read the memory cell 46. Isolation layer 66 isolates sense conductor 64 and memory cell 46 from write conductor 62 during read and write operations.

During a read operation, the read/write circuit 44 selects sense conductor 64 and bit line 50b to sense the resistance through memory cell 46 located at the cross point. Any number of methods can be used to sense the resistance. In the exemplary embodiment, a sense current is supplied through the sense conductor 64 and memory cell 46 to bit line 50b to produce a voltage across the selected memory cell 46. The voltage across memory cell 46 is detected over sense conductor 64 and bit line 50b, and used to determine the state of the memory cell 46. Circuits and methods for sensing the resistance and state of memory cells 46 are disclosed and described in U.S. Pat. No. 6,259,644, issued Jul. 10, 2001, entitled "Equipotential Sense Methods For Resistive Cross Point Memory Cell Arrays", which is incorporated herein by reference.

Bit line 50b includes a bit line conductor 68 and a structure 70 for reducing the coercivity of memory cell 46. The bit line conductor 68 extends the length of bit line 50b. Structure 70 encases bit line conductor 68 on three side surfaces of bit line conductor 68 and along the length of bit line 50b. One side surface of bit line conductor 68 is not encased by structure 70. The side surface of bit line conductor 68, which is not encased by structure 70, is adjacent memory cell 46. Bit line conductor 68 provides a path for electrical currents during read and write operations.

In the exemplary embodiment, structure 70 serves as cladding along three side surfaces of bit line conductor 68. The cladding structure 70 is a soft magnetic material that provides a mechanism for flux closure during a write operation, thereby reducing the formation of demagnetization fields in the memory cell 46. In one embodiment, the cladding structure 70 is a high permeability ferromagnetic film.

In the exemplary embodiment, write conductor 62 and sense conductor 64 have similar patterns. In other embodiments, write conductor 62 and sense conductor 64 can have different patterns, such as with write conductor 62 and sense conductor 64 being orthogonal to one another. In the exemplary embodiment, isolation layer 66 is an insulating film layer. In other embodiments, isolation layer 66 can be patterned. In the exemplary embodiment, word line 48a and bit line 50b are orthogonal to one another. In other embodiments, word line 48a and bit line 50b may lie in other suitable angular relationships to one another.

Figure 3:
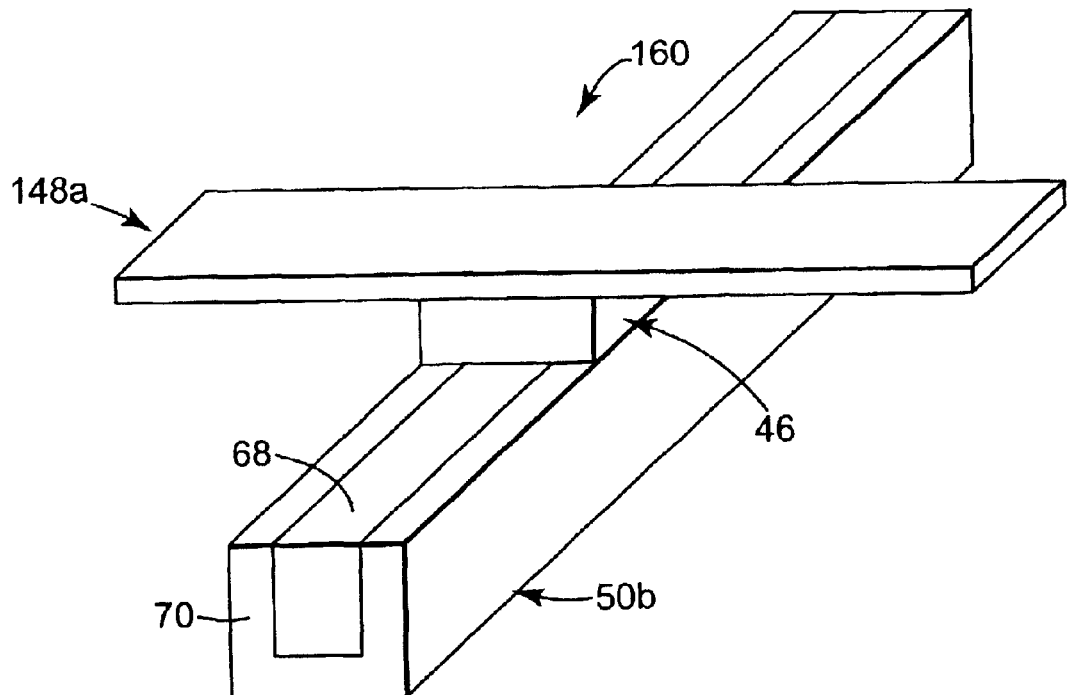
FIG. 3 is a diagram illustrating another exemplary embodiment of an array section.

FIG. 3 is a diagram illustrating another exemplary embodiment of an array section, indicated at 160. Array section 160 can be used in place of array section 60 in magnetic memory device 40. Array section 160 includes a bit line 50b, a memory cell 46 and a word line 148a. Sense conductor 64 and isolation layer 66 in array section 60 are not included in array section 160. Memory cell 46 is located between bit line 50b and word line 148a. In the exemplary embodiment, word line 148a and bit line 50b are orthogonal to one another. In other embodiments, word line 148a and bit line 50b may lie in other suitable angular relationships to one another.

In the exemplary embodiment, word line 148a and bit line 50b are electrically coupled to read/write circuit 44. The read/write circuit 44 supplies write currents to word line 148a and bit line 50b to create magnetic fields, according to the right hand rule, around the word line 148a and bit line 50b, and in memory cell 46. The magnetic fields combine to set the state of memory cell 46. The read/write circuit 44 supplies a sense current through word line 148a and memory cell 46 to bit line 50b to produce a voltage across memory cell 46. The voltage across memory cell 46 is detected through word line 148a and bit line 50b, and used to determine the state of memory cell 46. Circuits and methods for sensing the resistance and state of memory cells in this embodiment are disclosed and described in U.S. Pat. No. 6,259,644, previously referenced in this specification. In other embodiments, the read/write circuit 44 can be electrically coupled by other means to the memory cells 46, such as through; individual memory cell isolation transistors.

Figure 4:
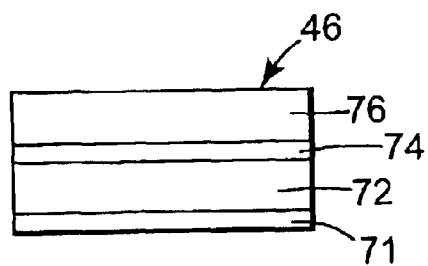
FIG. 4 is a diagram illustrating an exemplary embodiment of a memory cell.

FIG. 4 is a diagram illustrating one exemplary embodiment of memory cell 46. Memory cell 46 includes a non-magnetic layer 71, a sense layer 72, a spacer layer 74 and a reference layer 76. The sense layer 72 is located between the non-magnetic layer 71 and the spacer layer 74. The spacer layer 74 is located between the sense layer 72 and the reference layer 76. The sense layer 72 has an alterable magnetization state and the reference layer 76 has a pinned orientation of magnetization. In this embodiment, the memory cell is a spin tunneling device where the spacer layer 74 is a barrier layer through which an electrical charge migrates during read operations. Electrical charge migrations through the spacer layer 74 occur when a sense current is supplied through memory cell 46. In an alternative embodiment, a giant magnetoresistive (GMR) structure can be used for memory cell 46 and the spacer layer 74 is a conductor such as copper.

In the exemplary embodiment, the non-magnetic layer 71 is a non-insulating material, such as Ta or Ru. One example non-magnetic layer 71 has a thickness range of 0.5 nm to 20 nm. The non-magnetic layer 71 is patterned to be the same dimensions as the sense layer 72. In other embodiments, the non-magnetic layer 71 can be patterned like the cladded bit lines 50. Also, in other embodiments, the non-magnetic layer 71 can be a thin insulating material, such as AL2O3, SiO2, Si3N4 or Ta oxide. In these embodiments, the non-magnetic layer 71 can be a sheet film insulator. In each embodiment, the non-magnetic layer 71 prevents exchange interactions, such as exchange coupling, from occurring between the sense layer 72 and the cladded bit line 50b, where the non-magnetic layer 71 is adjacent the bit line 50b. In other words, the non-magnetic layer 71 is an exchange coupling break layer.

Figure 5:
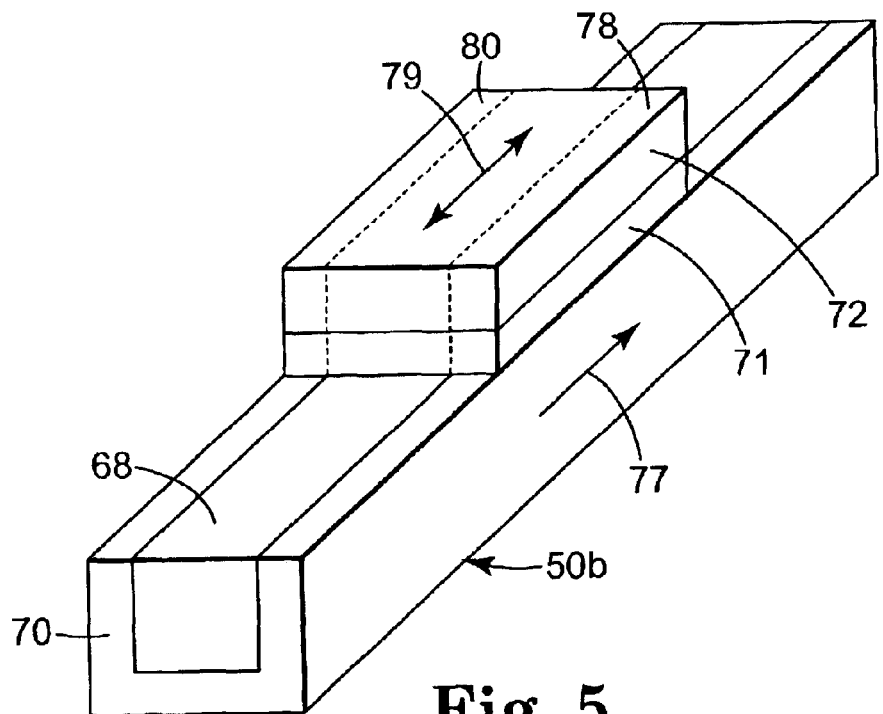
FIG. 5 is a diagram illustrating a bit line and a sense layer separated by a non-magnetic layer.

FIG. 5 is a diagram illustrating bit line 50b and sense layer 72 separated by non-magnetic layer 71. Bit line 50b includes bit line conductor 68 and structure 70. Bit line conductor 68 extends the length of bit line 50b. Structure 70 encases bit line conductor 68 on three side surfaces along the length of bit line 50b. Bit line conductor 68 is adjacent non-magnetic layer 71 at one side surface, which is not encased by structure 70. Structure 70 overlaps non-magnetic layer 71 and memory cell 46 at a pair of edge regions 78 and 80.

In the exemplary embodiment, structure 70 serves as cladding for bit line conductor 68 and can be referred to as cladding structure 70. In one embodiment, cladding structure 70 is a soft magnetic material that provides a mechanism for flux closure during a write operation. Flux closure prevents or reduces the magnitude of demagnetization fields in the edge regions 78 and 80 as the sense layer magnetization rotates through the hard axis direction during a write operation. In the exemplary embodiment, cladding structure 70 is a high permeability ferromagnetic film that has an orientation of magnetization, indicated at 77, in one direction along its easy axis. Cladding structure 70 has a higher permeability than bit line conductor 68. The cladding structure orientation of magnetization 77 is parallel to the sense layer easy axis, illustrated at 79 in sense layer 72.

In the exemplary embodiment, non-magnetic layer 71 is positioned next to bit line 50b and cladding structure 70. The non-magnetic layer 71 is interposed between the sense layer 72 and the cladding structure 70 to prevent exchange interactions, such as exchange coupling, between the sense layer 72 and cladding structure 70. In this embodiment, the orientation of magnetization 77 of cladding structure 70 has minimal influences on the magnetization state of sense layer 72 and edge regions 78 and 80. In other embodiments, the reference layer 76 can be adjacent the cladding structure 70 to achieve a similar result.

In the exemplary embodiment, the proximity of cladding structure 70 to memory cell 46 causes demagnetization fields to be directed through cladding structure 70. During the write process, sense layer magnetization 79 is rotated to have a component perpendicular to the easy axis direction. This component of magnetization creates a demagnetization field that opposes further rotation of magnetization. This demagnetization field results in a large field that must be overcome to switch the sense layer 72. Cladding structure 70 provides a path for flux that substantially eliminates this demagnetization field from acting on sense layer 72. Reducing or eliminating the demagnetization field, reduces the coercivity of memory cell 46. With reduced coercivity, lower currents can be used to create smaller magnetic fields to switch the state of memory cell 46.

Figure 6:
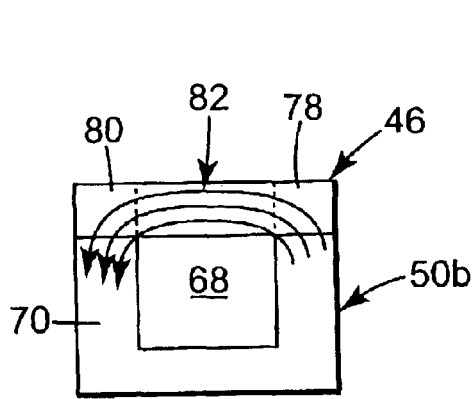
FIG. 6 is a diagram illustrating a cross section of a bit line and a memory cell.

FIG. 6 is a diagram illustrating a cross-section of bit line 50b and memory cell 46. Bit line 50b includes bit line conductor 68 encased on three side surfaces by cladding structure 70. Memory cell 46 is located adjacent bit line 50b along the side surface of bit line conductor 68 which is not encased with cladding structure 70. Cladding structure 70 overlaps memory cell 46 along edge regions 78 and 80. The non-magnetic layer 71 of memory cell 46 is adjacent bit line 50b and cladding structure 70.

During a write operation, a write current is supplied through bit line conductor 68 along the length of bit line 50b. The write current creates a magnetic field, indicated at 82, through the hard axis of sense layer 72 in memory cell 46. This hard axis magnetic field 82 is concentrated and intensified by cladding structure 70. Cladding structure 70 also provides flux closure for a component of sense layer magnetization as the sense layer 72 is rotated in the hard axis direction. The cladding structure 70 directs the magnetic fields through the memory cell 46. Flux closure through the hard axis of sense layer 72 and memory cell 46 reduces or prevents demagnetization fields in edge regions 78 and 80, during a write operation. Reducing demagnetization fields in the edge regions 78 and 80, reduces the coercivity of sense layer 72 in memory cell 46. With coercivity reduced, a lower write current can be supplied through the word line 48a to provide a smaller magnetic field along the easy axis 79 of sense layer 72 to set or switch the state of sense layer 72 and memory cell 46. Also, since bit line 50b includes cladding structure 70, which intensifies the magnetic field 82 and provides flux closure, a lower write current can be supplied through bit line 50b.

Figure 7:
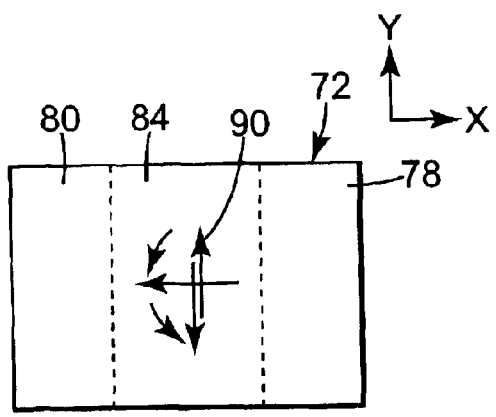
FIG. 7 is a diagram illustrating the orientation of magnetization in a sense layer during a write operation.

FIG. 7 is a diagram illustrating the orientation of magnetization in sense layer 72 before, during and after a write operation. Sense layer 72 includes edge regions 78 and 80, and internal region 84. Sense layer 72 has an orientation of magnetization, indicated at 90. In the present example, the sense layer orientation of magnetization 90 begins in the y-direction and pointing upward.

During a write operation, a write current is supplied to bit line conductor 68. This write current creates magnetic field 82, according to the right hand rule, through the hard axis of sense layer 72. Cladding structure 70 provides flux closure for the sense layer magnetization as the orientation of magnetization 90 rotates from a position parallel with the easy axis 79 of sense layer 72 to a position parallel with the hard axis of sense layer 72. The orientation of magnetization 90 rotates from the y-direction and pointing upward to the x-direction and pointing left, as indicated in FIG. 7. Flux closure for the sense layer magnetization reduces or prevents demagnetization fields from forming, which reduces the energy needed to switch the state of sense layer 72. In other words, this reduces the coercivity of sense layer 72.

A second write current is supplied to word line 48a to create a magnetic field along the easy axis 79 of sense layer 72. The easy axis magnetic field rotates the orientation of magnetization 90 from a position parallel with the hard axis to a position parallel with the sense layer easy axis 79, in the y-direction and pointing downward.

After the write currents are switched off, the orientation of magnetization 90 remains aligned along the easy axis 79 of sense layer 72 and pointing downward. As the write current through bit line conductor 68 is switched off, the hard axis magnetic field 82 around bit line conductor 68 goes away. As the hard axis magnetic field 82 goes away, the orientation of magnetization in cladding structure 70, returns to parallel with the easy axis 79 of sense layer 72.

Write current magnitudes can be reduced in a magnetic memory including cladding structure 70. The cladding structure 70 is analogous to a single-turn electromagnet. A write current flowing through bit line conductor 68 rotates the orientation of magnetization in cladding structure 70 from its easy axis along its length, to a direction perpendicular to the direction of electrical current flow, according to the right hand rule. Cladding structure 70 intensifies the magnetic field 82. Cladding structure 70 also provides flux closure for the sense layer magnetization. Since the cladding structure 70 intensifies the magnetic field 82, a smaller write current can be used through bit line 68.

Since cladding structure 70 provides flux closure for sense layer magnetization, demagnetization fields are reduced or prevented from forming in edge regions 78 and 80, which reduces the coercivity of sense layer 72, i.e., the energy needed to set or switch the state of sense layer 72 is reduced. With a lower coercivity, a lower write current can be supplied through word line 48a to create a magnetic field along the easy axis 79 of sense layer 72 to set or switch the state of sense layer 72.

What is claimed is:

1. A magnetic memory, comprising:
   a magnetic memory cell;
   a conductor configured to provide a magnetic field to write the magnetic memory cell; and
   structure configured to direct the magnetic field and reduce coercivity of the magnetic memory cell;
   wherein the structure is configured to have a higher permeability than the conductor to provide flux closure along a hard axis of the magnetic memory cell.

2. The magnetic memory of claim 1, wherein the structure encases at least a portion of the conductor to reduce the coercivity of the magnetic memory cell.

3. The magnetic memory of claim 2, wherein the structure overlaps first and second edge regions of the magnetic memory cell.

4. The magnetic memory of claim 1, wherein the structure has an orientation of magnetization parallel to an easy axis of the magnetic memory cell.

5. The magnetic memory of claim 1, wherein the magnetic memory cell comprises a sense layer separated from the structure by a non-magnetic layer.

6. A magnetic memory, comprising:
   a magnetic memory cell; a conductor configured to provide a magnetic field to write the magnetic memory cell;
   and
   structure configured to direct the magnetic field and reduce coercivity of the magnetic memory cell;
   wherein the magnetic memory cell comprises a sense layer separated from the structure by a non-magnetic layer; and
   wherein the non-magnetic layer has a thickness between 0.5 nm and 20.0 nm.

7. A magnetic memory, comprising:
   a magnetic memory cell;
   means for writing the magnetic memory cell; and means for reducing demagnetization fields in the magnetic memory cell to write the
   magnetic memory cell;
   wherein the means for providing magnetic fields comprises a conductor and the means for reducing demagnetization fields is configured as cladding on the conductor, wherein the cladding has a higher permeability than the conductor.

8. The magnetic memory of claim 7, wherein the means for writing the magnetic memory cell comprises a conductor and the means for reducing demagnetization fields encases the conductor on three side surfaces of the conductor.

9. The magnetic memory of claim 7, wherein the cladding is a ferromagnetic film.

10. The magnetic memory of claim 7, wherein the means for reducing demagnetization fields has an easy axis parallel to an easy axis of the magnetic memory cell.

11. The magnetic memory of claim 7, wherein the means for reducing demagnetization fields is adjacent one side of the magnetic memory cell.

12. The magnetic memory of claim 7, wherein the magnetic memory cell comprises a sense layer and a reference layer configured with the reference layer adjacent the means for reducing demagnetization fields.

13. A magnetic memory, comprising:

a magnetic memory cell;

means for writing the magnetic memory cell; and means for reducing demagnetization fields in the magnetic memory cell to write the magnetic memory cell comprising:
- a sense layer;
- a reference layer;
- a spacer layer located between the sense layer and the reference layer; and
- a non-magnetic layer adjacent the means for reducing demagnetization fields, wherein the sense layer is located between the spacer layer and the non-magnetic layer to eliminate exchange coupling between the sense layer and the means for reducing demagnetization fields.

14. A magnetic memory, comprising:

an array of magnetic memory cells;

first lines that cross magnetic memory cells in the array of magnetic memory cells;

second lines that intersect the first lines at the magnetic memory cells in the array of magnetic memory cells;

a write circuit configured to provide current to the first and second lines to write the magnetic memory cells in the array of magnetic memory cells; and structure configured to provide a path for magnetic flux to reduce demagnetization fields in the magnetic memory cells in the array of magnetic memory cells, the structure having a higher permeability than a conductor in the first lines.

15. The magnetic memory of claim 14, wherein the first lines are adjacent the structure at the magnetic memory cells in the array of memory cells.

16. The magnetic memory of claim 14, wherein the second lines comprise a write conductor and a sense conductor.

17. An array of magnetic memory cells, comprising:

magnetic memory cells electrically coupled to first lines that cross the magnetic memory cells and second lines that intersect the first lines at the magnetic memory cells, wherein the first lines are configured with structure having a higher permeability than a conductor in the first line, to provide flux closure along a hard axis of the magnetic memory cells;

wherein the magnetic memory cells comprise a sense layer and a non-magnetic layer situated between the sense layer and the structure to eliminate exchange coupling between the sense layer and the structure.

18. The array of claim 17, wherein the magnetic memory cells comprise a reference layer adjacent the structure.

* * * * *